(12) United States Patent
Klemin et al.

(10) Patent No.: US 7,447,874 B1
(45) Date of Patent: Nov. 4, 2008

(54) METHOD AND SYSTEM FOR DESIGNING A FLEXIBLE HARDWARE STATE MACHINE

(75) Inventors: Bruce A. Klemin, Rocklin, CA (US); Michael I. Thompson, Colfax, CA (US)

(73) Assignee: QLOGIC, Corporation, Aliso Viejo, CA (US)

( * ) Notice: Subject to any disclaimer, the term of this patent is extended or adjusted under 35 U.S.C. 154(b) by 104 days.

(21) Appl. No.: 11/252,524

(22) Filed: Oct. 18, 2005

(51) Int. Cl.
*G06F 19/00* (2006.01)

(52) U.S. Cl. .............................. 712/36; 712/39; 712/229

(58) Field of Classification Search .................... 703/14; 710/100
See application file for complete search history.

(56) References Cited

U.S. PATENT DOCUMENTS

| | | | | |
|---|---|---|---|---|
| 5,893,066 | A * | 4/1999 | Hong .......................... | 704/500 |
| 6,003,129 | A * | 12/1999 | Song et al. .................. | 712/244 |
| 6,199,031 | B1 * | 3/2001 | Challier et al. ............... | 703/14 |
| 6,331,856 | B1 * | 12/2001 | Van Hook et al. ............ | 345/503 |
| 6,826,717 | B1 * | 11/2004 | Draper et al. ................. | 714/39 |
| 7,047,462 | B2 * | 5/2006 | Brown et al. ................ | 714/724 |
| 7,058,855 | B2 * | 6/2006 | Rohfleisch et al. ............ | 714/28 |
| 7,065,633 | B1 * | 6/2006 | Yates et al. .................. | 712/227 |
| 7,072,818 | B1 * | 7/2006 | Beardslee et al. ............. | 703/14 |
| 7,174,194 | B2 * | 2/2007 | Chauvel et al. ............. | 455/574 |
| 2003/0120970 | A1 * | 6/2003 | Chen .......................... | 714/25 |
| 2003/0154430 | A1 * | 8/2003 | Allen et al. .................... | 714/45 |
| 2004/0015341 | A1 * | 1/2004 | Ferris .......................... | 703/28 |
| 2005/0172105 | A1 * | 8/2005 | Doering et al. ............... | 712/36 |

OTHER PUBLICATIONS

Synthesis and Optimization of Digital Circuits, by Giovanni DeMicheli, McGraw Hill, 1994, p. 22.*
Vahid et al. Embedded System Design, Wiley, 2002, p. 276.*

* cited by examiner

*Primary Examiner*—Henry W. H. Tsai
*Assistant Examiner*—Cheng-Yuan Tseng
(74) *Attorney, Agent, or Firm*—Klein, O'Neill & Singh, LLP; Tejinder Singh; Scott Loras Murray

(57) ABSTRACT

Method and system for performing hardware tasks using a hardware state machine and a processor is provided. The method includes, setting a breakpoint for a state machine state; running the processor in a parallel mode with the state machine; passing control to the processor after a breakpoint condition is encountered; performing a task, wherein the processor performs the task which was meant to be performed by the state machine; and transferring control back to the state machine after the processor performs the task. The system includes an Application Specific Integrated Circuit (ASIC) with the state machine, and the processor.

18 Claims, 3 Drawing Sheets

METHOD AND SYSTEM FOR DESIGNING A FLEXIBLE HARDWARE STATE MACHINE

BACKGROUND

1. Field of the Invention

This invention relates in general to the field of designing application specific integrated circuits ("ASICs"), and more specifically, to a hardware state machine for performing specific tasks that interfaces with a processor.

2. Background of the Invention

A state machine also called a "finite state machine," is a computing device designed with operational states required to solve a specific problem. Hardware state machines can be tailored to perform complex task faster by synthesizing to an optimized circuitry. For example, chips in audio, video and imaging controllers are often designed as state machines, because they can provide faster performance at lower cost than a general-purpose processor.

A state machine is a model of behavior composed of states, transitions and actions. A state stores information about the past, i.e. it reflects the input changes from the system start to the present moment. A transition indicates a state change and is described by a condition that would need to be fulfilled to enable the transition. An action is a description of an activity that is to be performed at a given moment.

State machines are devices that are typically used in a larger ASIC. The process of designing an ASIC includes writing a specification; defining the architecture; designing the state machine in a hardware description language; synthesizing the design into a physical layout; manufacturing in a wafer fabrication facility; testing the functionality of the chip; and releasing the design to production.

Conventional hardware state machine/ASIC design approach has shortcomings. For example, when hardware state machines are fabricated, conventional processes do not provide flexibility to change state machine operations to either correct problems with the state machine, or to implement new algorithmic approaches without tedious re-design and re-fabrication efforts. The redesign and re-fabrication is expensive and time consuming, and hence undesirable.

Therefore, what is needed is a system and method to efficiently design ASICs/state machines without expensive re-design/re-fabrication steps.

SUMMARY OF THE INVENTION

In one aspect of the present invention, a method for performing hardware tasks using a hardware state machine and a processor is provided. The method includes, setting a breakpoint for a state machine state; running the processor in a parallel mode with the state machine; passing control to the processor after a breakpoint condition is encountered; performing a task, wherein the processor performs the task which was meant to be performed by the state machine; and transferring control back to the state machine after the processor performs the task.

In another aspect of the present invention, an Application Specific Integrated Circuit (ASIC) is provided. The ASIC comprises, a state machine that has plural states and can execute plural tasks associated with the plural states; and a processor that runs in parallel with the state machine, wherein control is passed to the processor from the state machine after a breakpoint condition is encountered and the break point condition is pre-set for a state of the state machine and the processor performs a task which was meant to be performed by the state machine; and control is transferred to the state machine after the processor performs the task.

This brief summary has been provided so that the nature of the invention may be understood quickly. A more complete understanding of the invention can be obtained by reference to the following detailed description of the preferred embodiments thereof concerning the attached drawings.

BRIEF DESCRIPTION OF THE DRAWINGS

The foregoing features and other features of the present invention will now be described with reference to the drawings of a preferred embodiment. In the drawings, the same components have the same reference numerals. The illustrated embodiment is intended to illustrate, but not to limit the invention. The drawings include the following Figures.

DETAILED DESCRIPTION OF THE PREFERRED EMBODIMENTS

To facilitate an understanding of the preferred embodiment, the general process for designing an ASIC will be described. The specific architecture and operation of the preferred embodiment will then be described with reference to the general description.

Figure 1:
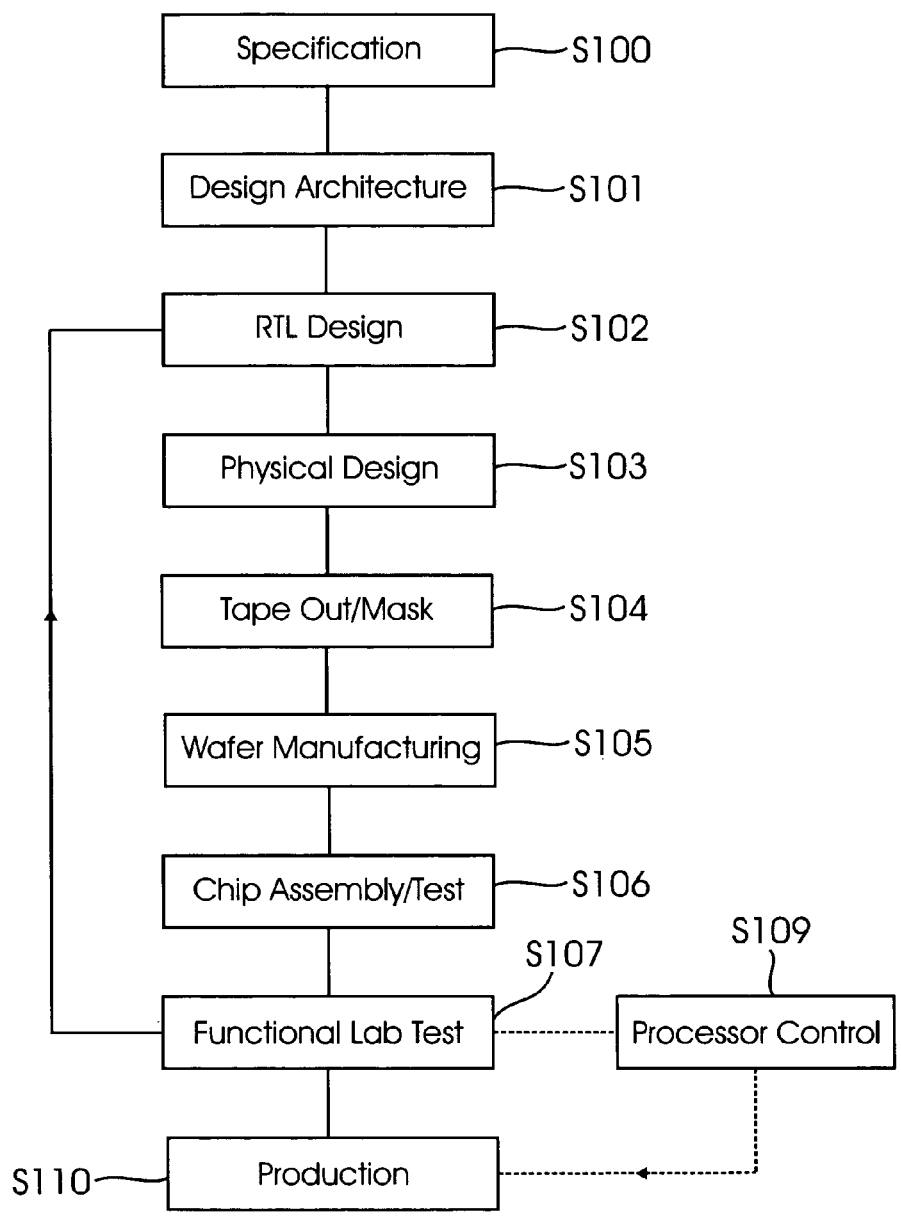
FIG. 1 shows a conventional process flow diagram for designing/fabricating ASICs and how the shortcomings are minimized, according to one aspect of the present invention.

FIG. 1 illustrates the problem associated with designing a state machine according to a conventional process flow and how it is minimized, according to one aspect of the present invention.

The process starts in step S100, when the specification for the ASIC is defined. The design architecture is built in step S101 and the register transfer logic ("RTL") design is completed in step S102. Thereafter, The physical design is completed in step S103 and the masks for actual fabrication is performed in step S104.

Wafer fabrication occurs in step S105 and the chip assembly is tested in step S106. A functional laboratory test is performed in step S107. If the functional test is successful, then the chip is released for production in step S110.

In the conventional processes, if the functional test fails and any changes have to be made in the ASIC or state machines, the design process for the change is repeated from step S102. This iterative process continues until the chip is acceptable. This is expensive and tedious.

The present invention solves this problem by using a processor inside the ASIC to control the state machine, thereby, reaching the final goal of production quickly and inexpensively. In step S109, after the functional laboratory test, control is passed to a processor and the processor can be programmed to perform a function (typically the function that failed in the functional test) efficiently. Once the processor solves the functional problems, the chip is sent for production in step S110. Details regarding steps S109 are provided below with respect to FIGS. 2 and 3.

Figure 2:
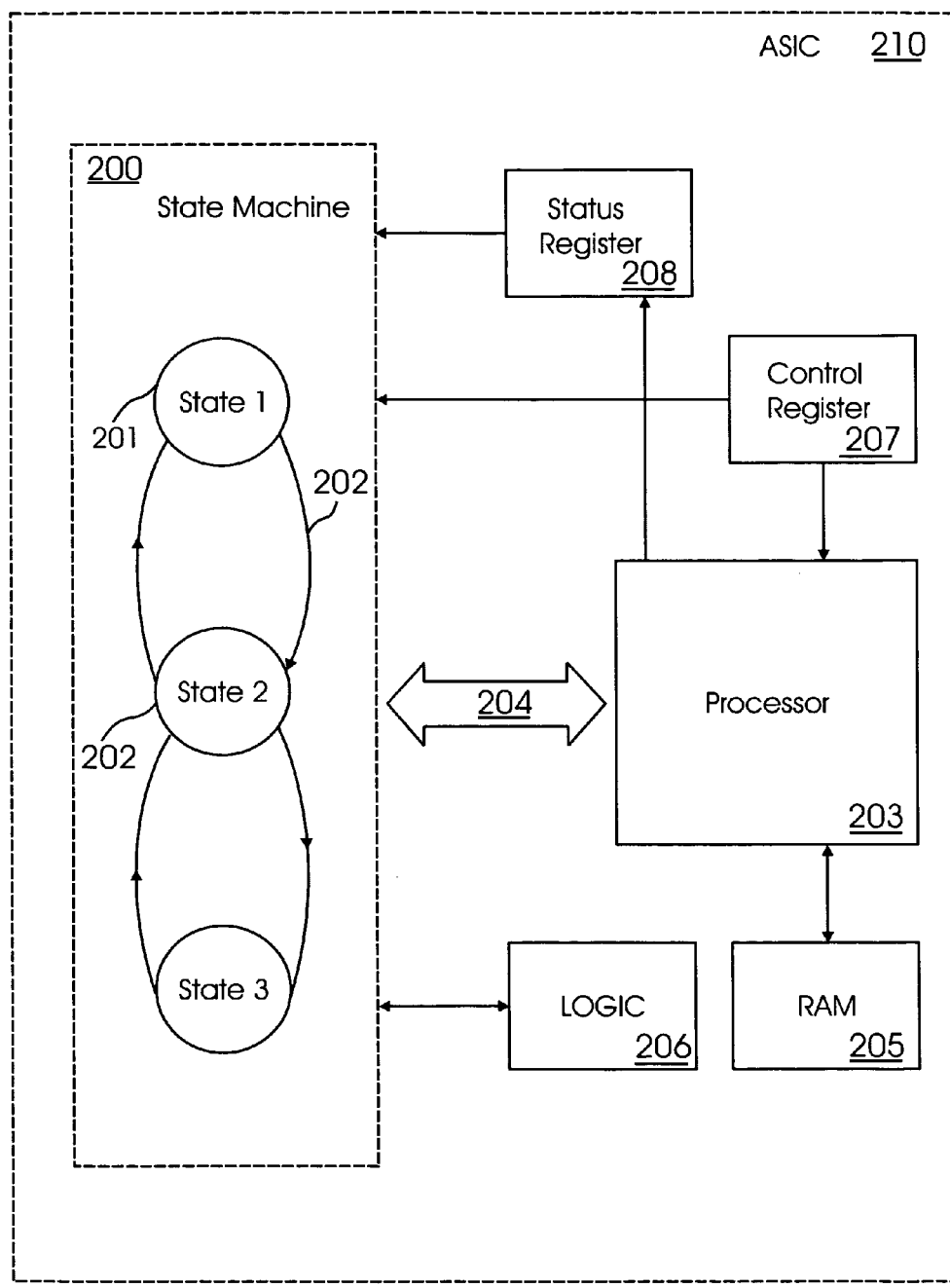
FIG. 2 is a top-level system diagram of an ASIC with a state machine working in parallel with a processor, according to one aspect of the present invention.

FIG. 2 shows a system diagram of an ASIC 210 that includes a general-purpose state machine 200 operationally coupled to a processor 203 (via bus (or connection) 204).

ASIC 210 also include a control register 207, status register 208 and other components like random access memory 205 and logic 206.

State machine 200 is a model of behavior composed of states, transitions and actions. A state 201 stores information about the past, i.e. it reflects the input changes from the system start to a present moment. A transition 202 indicates a state change and is described by a condition that would need to be fulfilled to enable the transition. An action is a description of an activity that is to be performed at a given moment.

Processor 203 is an embedded processor used for controlling the state machine 200. Processor 203 can be custom designed for lower power and lower area or can be bought from companies like ARM®, Tensilica® and others. One skilled in the art would appreciate that processor 203 executes instructions from an image loaded into random access memory (RAM) (or any other type of memory) 205.

Control register 207 is programmed with break point information for each state (for example, for State 1, State 2 and State 3). When a breakpoint condition is encountered (or occurs) at any given time, control from the state machine 200 is passed to processor 203. Status register 208 stores the status of each task for each state. Processor 203 then performs the task and after it completes the task it updates status register 208 and control is then passed back to state machine 200.

Hence, when an ASIC 210 is being tested (107) and a problem is discovered with a particular task for a particular state of the state machine, then a break point condition can be set in control register 207. When that "problem" state is reached, control is passed to processor 203, which then performs the task. Hence, programming the control register instead alleviates the need for expensive re-design and re-fabrication of ASIC 210.

It is noteworthy that although one state machine is shown in FIG. 2, plural state machines can be controlled by processor 203, according to one aspect of the present invention.

Figure 3:
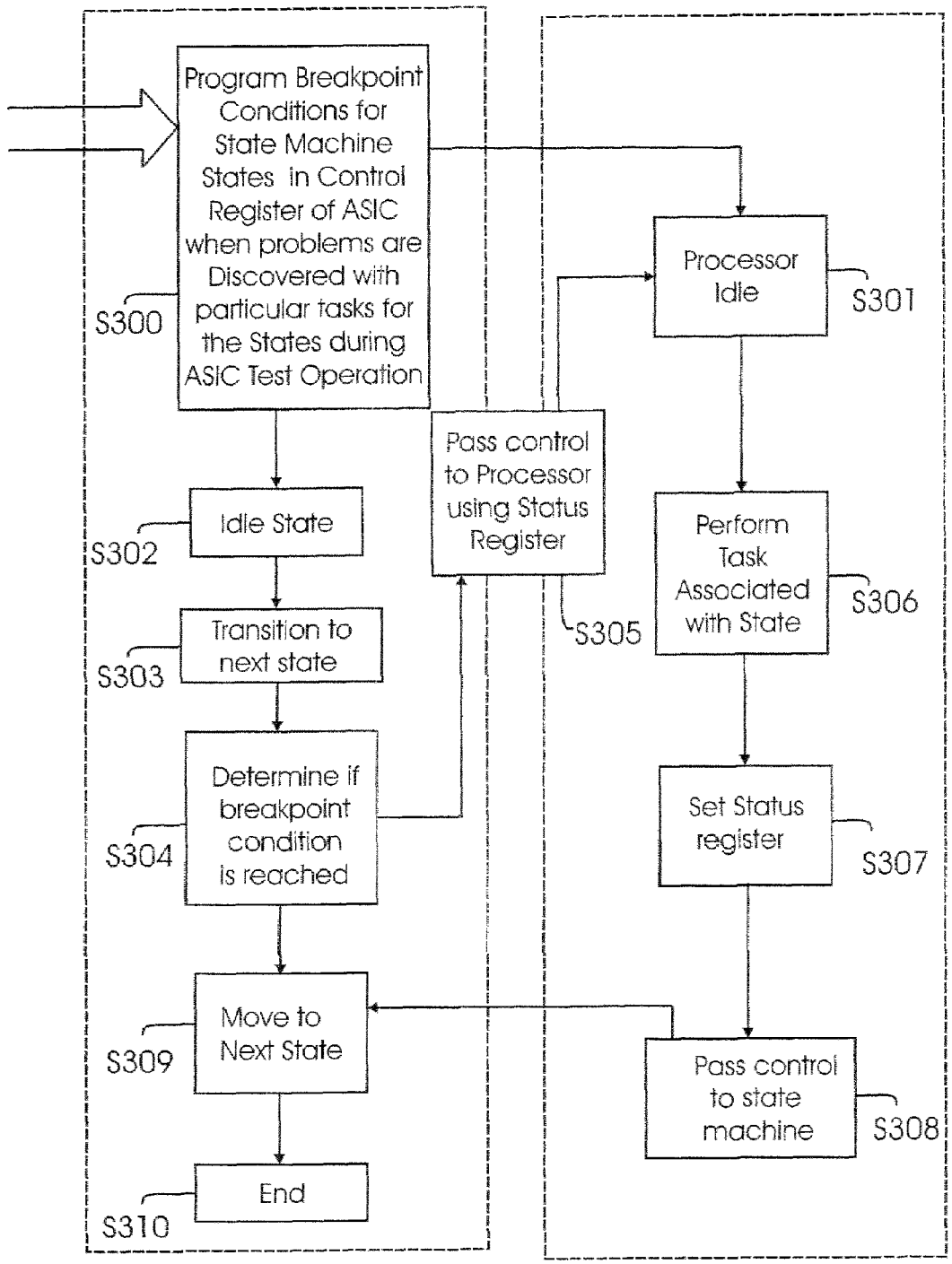
FIG. 3 is a process flow diagram showing interaction between a hardware state machine and a processor, according to yet another aspect of the present invention.

FIG. 3 shows a flow chart where processor 203 controls the state machine 200 using the control and status registers (207 and 208), according to one aspect of the present invention. The process flow starts at step S300 when the control register 207 is programmed with the breakpoint information for individual states of the state machine 200. For example, state 1, state 2 and state 3 can each have break point conditions and these are stored in control register 207. The breakpoint information is accessible by the state machine 200 and processor 203.

In step 302, state machine 200 is in an idle state and in step 301, processor 203 is in an idle state. Both steps S301 and S302 can occur simultaneously.

In step S303, the state machine 200 transitions from state 1 (idle state) to a current state.

In step 304, a determination is made as to whether a breakpoint is set by reading a control register 207 bit for this state (i.e. the step S303 state). State machine 200 checks control register 207 to see if a bit has been set for the current state. If the control register 207 bit is set, then in step 305, control is transferred to processor 203 via the status register 208.

In step S306, processor 203 performs the task that the state machine was intended to perform. After the task is completed, in step S307, processor 203 sets a status bit in status register 208. Thereafter, in step S308, control is passed back to the state machine 200. At this point, if there are no more states in the state machine, the process ends in step S310.

If a break point condition is not reached or set, then in step S309, the task is performed by state machine 200 in the current state and the state machine moves to the next state in step S309. This continues until the process ends in step S310.

As illustrated above, when an ASIC has problems, processor 203 performs certain functions to overcome the problems associated with certain state machine performed tasks. Hence, changes can be made to algorithms and any other chip functionality easily without expensive re-design/fabrication costs.

In one aspect, the present invention provides a method and apparatus for designing a hardware state machine to perform hardware tasks by using a processor to control the state machine, thereby providing flexibility to the state machine.

In another aspect, the present invention provides a mechanism to perform algorithms and changes after the state machine has been fabricated.

Although the present invention has been described with reference to specific embodiments, these embodiments are illustrative only and not limiting. Many other applications and embodiments of the present invention will be apparent in light of this disclosure and the following claims.

What is claimed is:

1. A method for performing hardware tasks in an application specific integrated circuit (ASIC) with a hardware state machine and a processor, comprising:

setting a breakpoint condition for a state machine state by programming a control register in the ASIC, wherein the breakpoint condition is set for the state after a problem is discovered with a particular task for the state;

running the processor in a parallel mode with the state machine;

using a status register to pass control to the processor after the breakpoint condition is encountered, wherein the state machine passes control to the processor after the state machine detects that the breakpoint condition has occurred for the state;

performing a task associated with the state, wherein the processor performs the task which was meant to be performed by the state machine; and transferring control back to the state machine after the processor performs the task associated with the state;

wherein the ASIC comprises the hardware state machine and the processor in a single component.

2. The method of claim 1, wherein the breakpoint condition is set for any or all states of the state machine.

3. The method of claim 1, wherein the state machine checks the control register after transitioning from one state to another state to determine if the breakpoint condition is set in the control register.

4. The method of claim 1 wherein the processor for the ASIC is an embedded processor.

5. The method of claim 1, further comprising setting additional breakpoint conditions for a plurality of additional states for a plurality of additional state machines and the processor performs a plurality of additional tasks associated with the plurality of additional states.

6. The method of claim 1, wherein the problem is discovered with the particular task for the state during an ASIC testing operation.

7. An Application Specific Integrated Circuit (ASIC), comprising:

a state machine that executes a plurality of tasks associated with a plurality of states; and a processor that runs in parallel with the state machine;

wherein a status register passes control to the processor from the state machine after a breakpoint condition associated with a state is encountered, where the breakpoint condition is pre-set for the state of the state machine by setting a bit in a control register after a problem is discovered with a particular task for the state; and the processor performs the task which was meant to be performed by the state machine and control is transferred to the state machine after the processor performs the task.

8. The ASIC of claim 7, wherein the breakpoint condition is set for any or all states of the state machine.

9. The ASIC of claim 7, wherein after transitioning from one state to another state, the state machine checks the control register to determine if a breakpoint condition is set for a current state.

10. The ASIC of claim 7, wherein the processor is an embedded processor that accesses a random access memory to execute instructions.

11. The ASIC of claim 7, further comprising setting additional breakpoint conditions for a plurality of additional states for a plurality of additional state machines and the processor performs a plurality of additional tasks associated with the plurality of additional states.

12. The ASIC of claim 7, wherein the problem is discovered with the particular task for the state during an ASIC testing operation.

13. A method for designing an application specific integrated circuit (ASIC) with a hardware state machine and a processor, comprising:

setting a breakpoint condition for a state machine state by programming a control register in the ASIC;

using a status register to pass control to the processor after the breakpoint condition is encountered, wherein the state machine passes control to the processor after the state machine detects that the breakpoint condition has occurred for the state;

the processor performing a task associated with the state, wherein the task was meant to be performed by the state machine but a problem was discovered with the particular task for the state; and transferring control back to the state machine after the processor performs the task associated with the state;

wherein the ASIC comprises the hardware state machine and the processor in a single component.

14. The method of claim 13, wherein the breakpoint condition is set for any or all states of the state machine.

15. The method of claim 13, wherein the state machine checks the control register after transitioning from one state to another state to deter nine if the breakpoint condition is set.

16. The method of claim 13, wherein the processor for the ASIC is an embedded processor.

17. The method of claim 13, wherein further comprising setting additional breakpoint conditions for a plurality of additional states for a plurality of additional state machines and the processor performs a plurality of additional tasks associated with the plurality of additional states.

18. The method of claim 13, wherein the problem is discovered with the particular task for the state during a functional test to determine if the state machine can perform one or more tasks associated with one or more states of the state machine.

* * * * *

UNITED STATES PATENT AND TRADEMARK OFFICE
CERTIFICATE OF CORRECTION

PATENT NO. : 7,447,874 B1  Page 1 of 1
APPLICATION NO. : 11/252524
DATED : November 4, 2008
INVENTOR(S) : Bruce A. Klemin et al.

It is certified that error appears in the above-identified patent and that said Letters Patent is hereby corrected as shown below:

In column 6, line 16, in claim 15, delete "deter nine" and insert -- determine --, therefor.

Signed and Sealed this

Sixteenth Day of November, 2010

David J. Kappos
*Director of the United States Patent and Trademark Office*